United States Patent
Vaschenko

(10) Patent No.: US 11,448,967 B2
(45) Date of Patent: Sep. 20, 2022

(54) TARGET FORMATION APPARATUS

(71) Applicant: ASML Netherlands B.V., Veldhoven (NL)

(72) Inventor: Georgiy Olegovich Vaschenko, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 47 days.

(21) Appl. No.: 17/273,978

(22) PCT Filed: Sep. 20, 2019

(86) PCT No.: PCT/US2019/052285
§ 371 (c)(1),
(2) Date: Mar. 5, 2021

(87) PCT Pub. No.: WO2020/068598
PCT Pub. Date: Apr. 2, 2020

(65) Prior Publication Data
US 2021/0311398 A1     Oct. 7, 2021

Related U.S. Application Data

(60) Provisional application No. 62/735,420, filed on Sep. 24, 2018.

(51) Int. Cl.
*G03F 7/20*     (2006.01)
*C23C 4/123*    (2016.01)
*H05G 2/00*     (2006.01)

(52) U.S. Cl.
CPC .......... *G03F 7/70033* (2013.01); *C23C 4/123* (2016.01); *H05G 2/003* (2013.01); *H05G 2/006* (2013.01)

(58) Field of Classification Search
CPC ..... G03F 7/70033; C23C 4/123; H05G 2/003; H05G 2/006
See application file for complete search history.

(56) References Cited

U.S. PATENT DOCUMENTS

| 4,308,546 A | 12/1981 | Halasz |
| 4,897,673 A | 1/1990 | Okabayashi et al. |
| 5,598,200 A | 1/1997 | Gore |

(Continued)

FOREIGN PATENT DOCUMENTS

| CN | 103074027 A | 5/2013 |
| JP | S60250961 A | 12/1985 |
| WO | 2017121573 A1 | 7/2017 |

OTHER PUBLICATIONS

Chiara Giovanardi, European International Searching Authority, International Search Report and Written Opinion, corresponding PCT Application No. PCT/US2019/052285, dated Jan. 3, 2020, 11 pages total.

(Continued)

*Primary Examiner* — Nicole M Ippolito
*Assistant Examiner* — Hanway Chang
(74) *Attorney, Agent, or Firm* — DiBerardino McGovern IP Group LLC

(57) ABSTRACT

A system for an extreme ultraviolet light source includes a capillary tube, the capillary tube including a sidewall extending from a first end to a second end, the sidewall including an exterior wall and an interior wall, the interior wall defining a passage that extends from the first end to the second end; an actuator configured to be positioned at the exterior wall of the capillary tube; and an adhesive between the exterior wall and the actuator, the adhesive being configured to mechanically couple the actuator and the capillary tube, wherein the adhesive occupies a volume that remains substantially the same or expands as a result of curing.

21 Claims, 9 Drawing Sheets

(56) References Cited

U.S. PATENT DOCUMENTS

| | | |
|---|---|---|
| 6,224,180 B1 | 5/2001 | Pham-Van-Diep et al. |
| 7,449,703 B2 | 11/2008 | Bykanov |
| 7,883,170 B2 | 2/2011 | Toyoda et al. |
| 8,158,960 B2 | 4/2012 | Vaschenko et al. |
| 8,872,126 B2 | 10/2014 | Umeda et al. |
| 9,307,625 B2 | 4/2016 | Rollinger et al. |
| 9,392,678 B2 | 7/2016 | De Dea et al. |
| 2008/0158309 A1 | 7/2008 | Toyoda et al. |
| 2012/0228526 A1 | 9/2012 | Vaschenko |
| 2013/0146682 A1 | 6/2013 | Ishihara et al. |
| 2014/0151582 A1 | 6/2014 | Rollinger et al. |
| 2014/0160450 A1 | 6/2014 | Loopstra et al. |
| 2014/0239203 A1 | 8/2014 | Umeda et al. |
| 2015/0340590 A1 | 11/2015 | Ivri |

OTHER PUBLICATIONS

Philippe Cognard, Ed., Adhesives and Sealants: Basic Concepts and High Tech Bonding, Handbook of Adhesives and Sealants, vol. 1, Elsevier, Amsterdam, NL, pp. 1, 338 (2005).

Tushar Shah et al., "Cyanate Ester Die Attach Material for Radiation Hardened Electronic Packages", Adhesive Joining and Coating Technology in Electronics Manufacturing, Proceedings of 3rd International Conf., Binghamton, NY, Sep. 28-30, 1998, pp. 49-54 (1998).

Advanced Materials: Benzoxazine Thermoset Resins: High-Performance Materials for Extreme Environments, Huntsman Corporation (2015).

AroCy® XU 371 Cyanate Ester, Advanced Materials Technical Datasheet, Huntsman Corporation (2015).

AroCy® XU 371 US, Safety Data Sheet, Huntsman Corporation (2015).

Michael R. Kessler, "Cyanate Ester Resins," Wiley Encyclopedia of Composites, 2d Ed., John Wiley & Sons, Inc. (2012).

S. Rimdusit et al., "Chapter 2: Polybenzoxazine Alloys," Alloys and Composites of Polybenzoxazines, Springer Science+Business Media Singapore, pp. 29-46 (2013).

Bob Rollinger, "Droplet target for laser-produced plasma light sources," Dissertation, Swiss Federal Institute of Technology (ETH Zurich) (2012).

Thermal Decomposition of Cyanate Ester Resins Final Report, Office of Aviation Research, DOT/FAA/AR-01/32, National Technical Information service (2001).

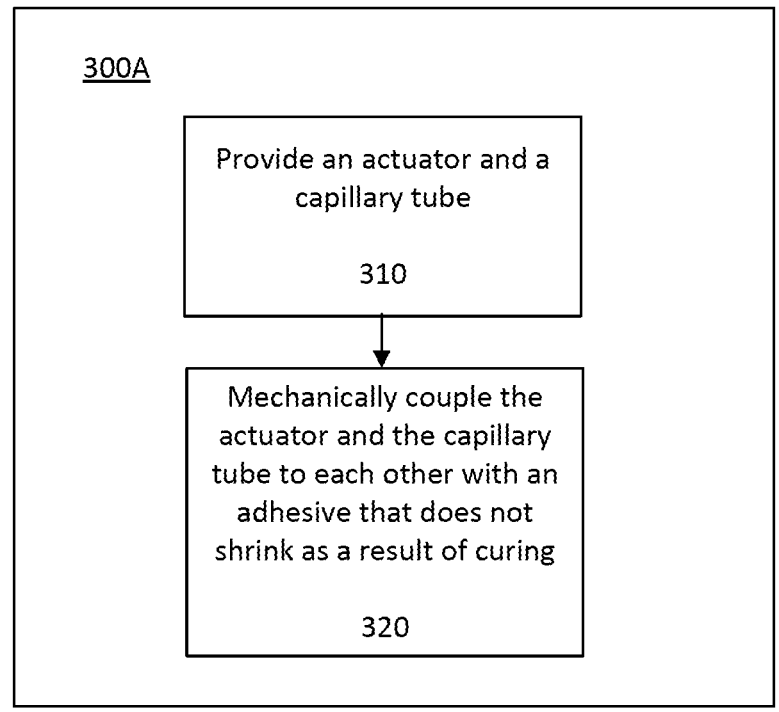
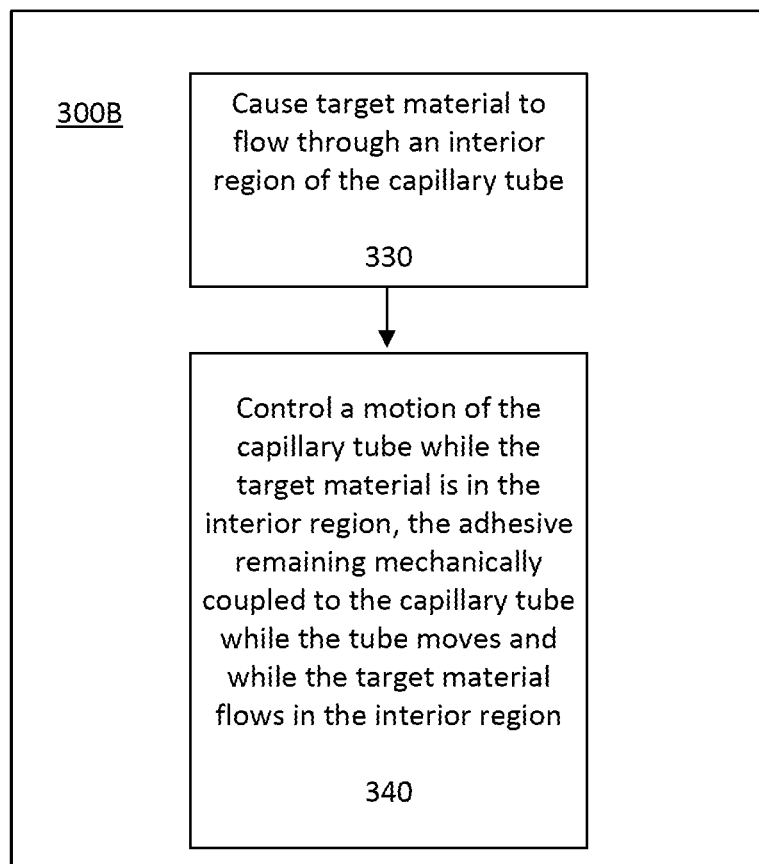
FIG. 3

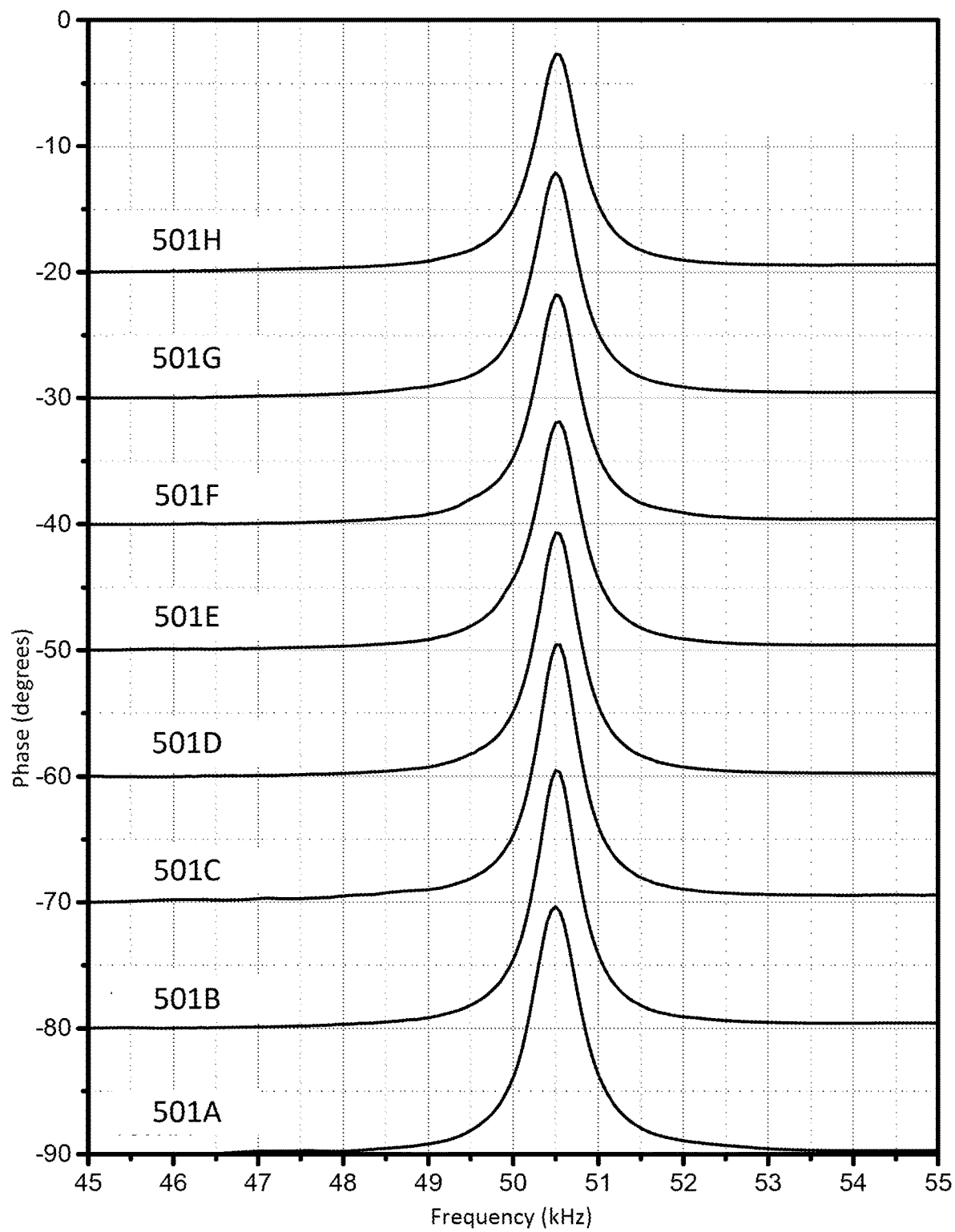

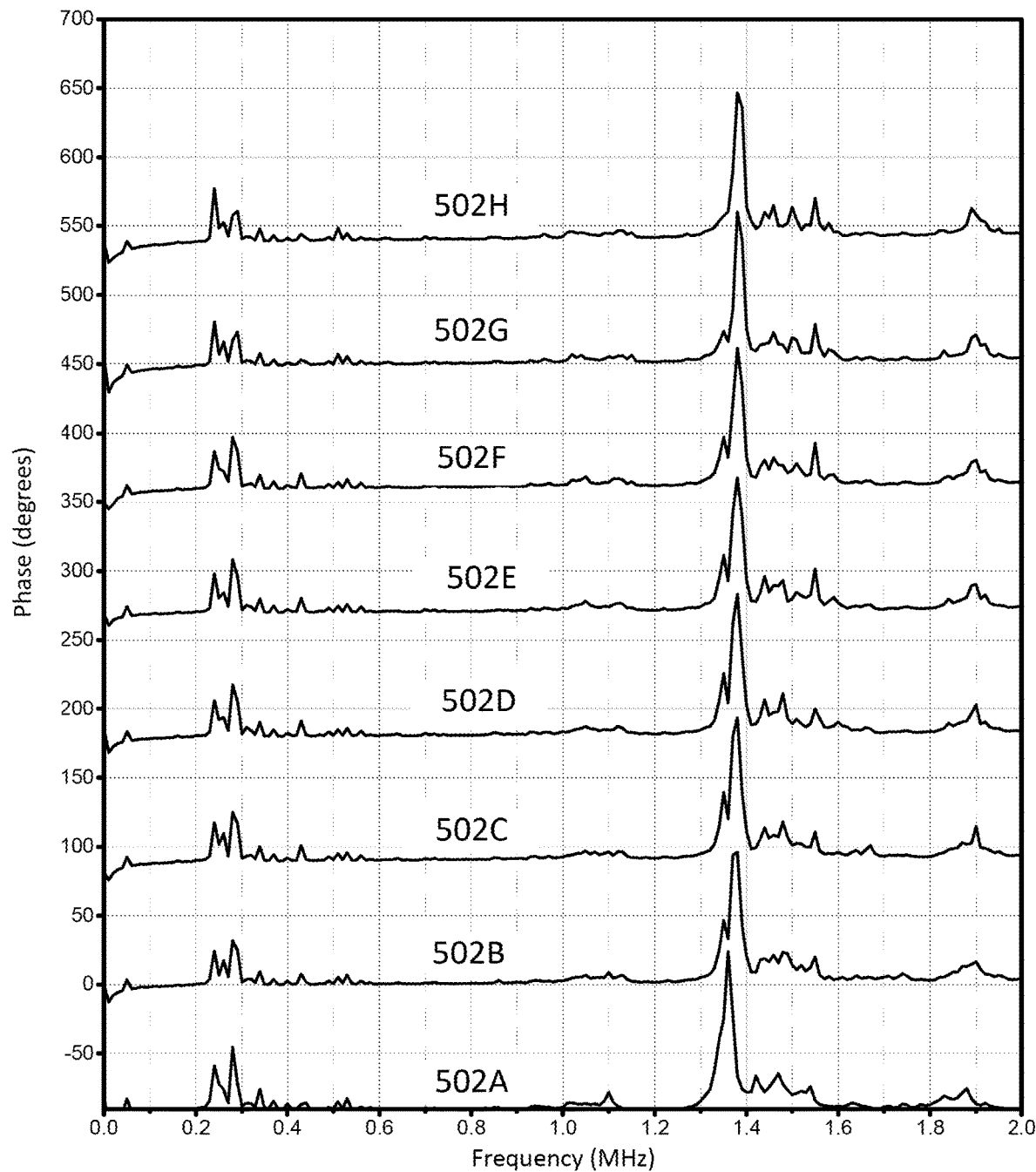

TARGET FORMATION APPARATUS

CROSS REFERENCE TO RELATED APPLICATIONS

This application claims priority of U.S. Application No. 62/735,420 which was filed on Sep. 24, 2018 and titled TARGET FORMATION APPARATUS, and which is incorporated herein in its entirety by reference.

TECHNICAL FIELD

This disclosure relates to a target formation apparatus for an extreme ultraviolet (EUV) light source.

BACKGROUND

Extreme ultraviolet ("EUV") light, for example, electromagnetic radiation having wavelengths of 100 nanometers (nm) or less (also sometimes referred to as soft x-rays), and including light at a wavelength of, for example, 20 nm or less, between 5 and 20 nm, or between 13 and 14 nm, may be used in photolithography processes to produce extremely small features in substrates, for example, silicon wafers, by initiating polymerization in a resist layer.

Methods to produce EUV light include, but are not necessarily limited to, converting a material that includes an element, for example, xenon, lithium, or tin, with an emission line in the EUV range in a plasma state. In one such method, often termed laser produced plasma ("LPP"), the required plasma may be produced by irradiating a target material, for example, in the form of a droplet, plate, tape, stream, or cluster of material, with an amplified light beam that may be referred to as a drive laser. For this process, the plasma is typically produced in a sealed vessel, for example, a vacuum chamber, and monitored using various types of metrology equipment.

SUMMARY

In one general aspect a system for an extreme ultraviolet light source includes a capillary tube, the capillary tube including a sidewall extending from a first end to a second end, the sidewall including an exterior wall and an interior wall, the interior wall defining a passage that extends from the first end to the second end; an actuator configured to be positioned at the exterior wall of the capillary tube; and an adhesive between the exterior wall and the actuator, the adhesive being configured to mechanically couple the actuator and the capillary tube. The adhesive occupies a volume that remains substantially the same or expands as a result of curing.

Implementations may include one or more of the following features. The adhesive may occupy a volume that remains substantially the same or expands while the temperature of the adhesive is increased. The adhesive may occupy a volume that continues to expand or remains substantially the same when the temperature of the adhesive is above a temperature associated with a gel point of the adhesive.

The adhesive may occupy a volume that remains substantially the same or expands at least at some temperatures above a gel point of the adhesive.

The adhesive may include a benzoxazine resin or a resin containing benzoxazines.

The adhesive may include a cyanate ester resin or a resin containing cyanate esters.

The actuator may surround at least a portion of the exterior wall of the capillary tube, and the adhesive may surround the portion of the exterior wall of the capillary tube. The actuator may include a piezo-electric modulator.

The system also may include a control system coupled to the actuator, the control system being configured to provide an actuation signal to the actuator, the actuation signal being sufficient to cause the actuator to vibrate at a frequency.

In another general aspect, a system for an extreme ultraviolet light source includes a tube including a sidewall extending from a first opening at a first end to a second opening at a second end, the sidewall including an exterior wall and an interior wall, the interior wall defining a passage that extends from the first end to the second end; an actuator that surrounds a portion of the exterior wall of the tube; and an adhesive that fills a region between the portion of the exterior wall and the actuator such that the adhesive is in contact with the portion of the exterior wall and the actuator. During operational use, molten metal target material flows into the second opening of the tube and out of the first opening of the tube while the actuator vibrates the tube to form a stream of target material droplets, and the adhesive remains in contact with the portion of the exterior wall and the actuator.

Implementations may include one or more of the following features. During operational use, the exterior wall may be heated to a temperature that is greater than a curing temperature of the adhesive, and the adhesive remains in contact with the portion of the exterior wall and the actuator when the exterior wall is heated to the temperature that is greater than the curing temperature.

The adhesive may occupy a volume that remains substantially the same or expands while increasing the temperature of the adhesive. The adhesive may occupy a volume that continues to expand or remains substantially the same when the temperature of the adhesive is above a temperature associated with a gel point of the adhesive.

The adhesive may occupy a volume that remains substantially the same or expands at least at some temperatures above a gel point of the adhesive.

The adhesive may include a benzoxazine resin or a resin containing benzoxazines.

The adhesive may include a cyanate ester resin or a resin containing cyanate esters.

The actuator may surround at least a portion of the exterior wall of the capillary tube, and the adhesive may surround the portion of the exterior wall of the capillary tube.

In another general aspect, an extreme ultraviolet light source includes: a vacuum vessel; and a target material supply system configured to supply target material to an interior of the vacuum vessel, the target material supply system including: a reservoir configured to hold molten target material and to apply pressure to the molten target material, the molten target material emitting extreme ultraviolet light when in a plasma state; and a droplet generator including: a capillary tube, the capillary tube including a sidewall extending from a first end to a second end, the sidewall including an exterior wall and an interior wall, the interior wall defining a passage that extends from the first end to the second end, the passage configured to receive molten target material from the reservoir; an actuator configured to be positioned at the exterior wall of the capillary tube; and an adhesive that has a volume that remains substantially the same or expands as a result of curing, the adhesive being between the exterior wall and the actuator, and the adhesive being configured to mechanically couple the actuator and the capillary tube.

Implementations may include one or more of the following features. The adhesive may occupy a volume that remains substantially the same or expands while increasing the temperature of the adhesive. The adhesive may occupy a volume that continues to expand or remains substantially the same when the temperature of the adhesive is above a temperature associated with a gel point of the adhesive. The adhesive may occupy a volume that remains substantially the same or expands during curing.

Implementations of any of the techniques described above may include an EUV light source, a system, a method, a process, a device, or an apparatus. The details of one or more implementations are set forth in the accompanying drawings and the description below. Other features will be apparent from the description and drawings, and from the claims.

DRAWING DESCRIPTION

FIG. 3 includes a flow chart of an example of a process 300A for fabricating a target formation apparatus and a flow chart of an example of a process 300B for operating a target formation apparatus.

FIGS. 4 and 5A-5C are examples of experimental data.

Figure 6A:
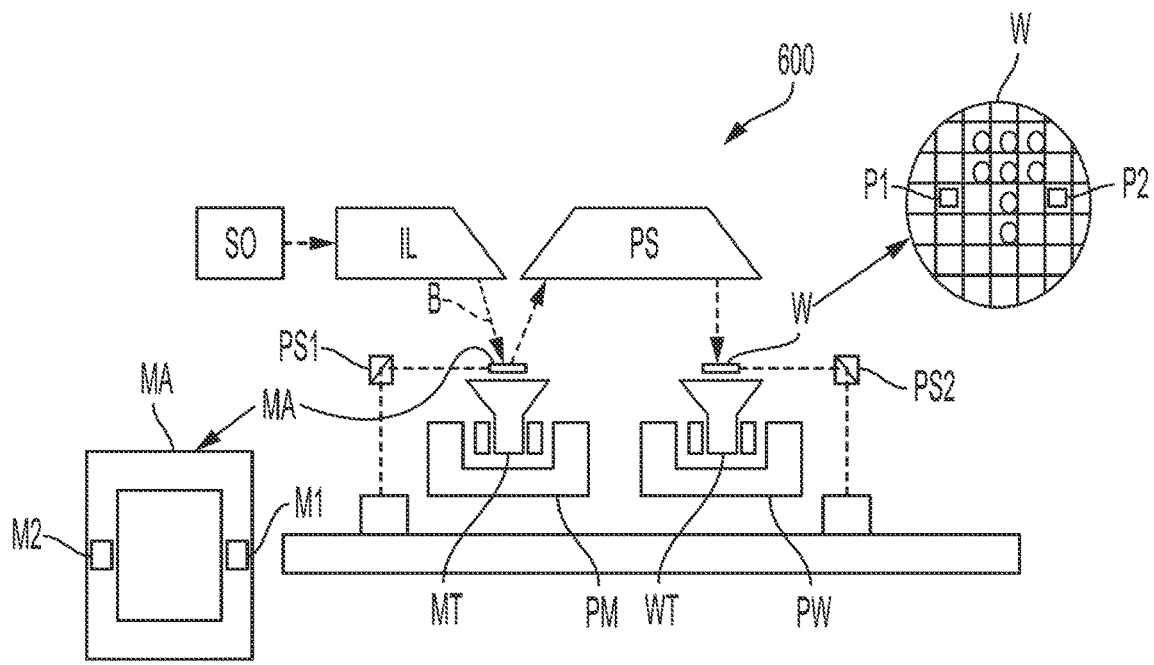
Figure 6B:
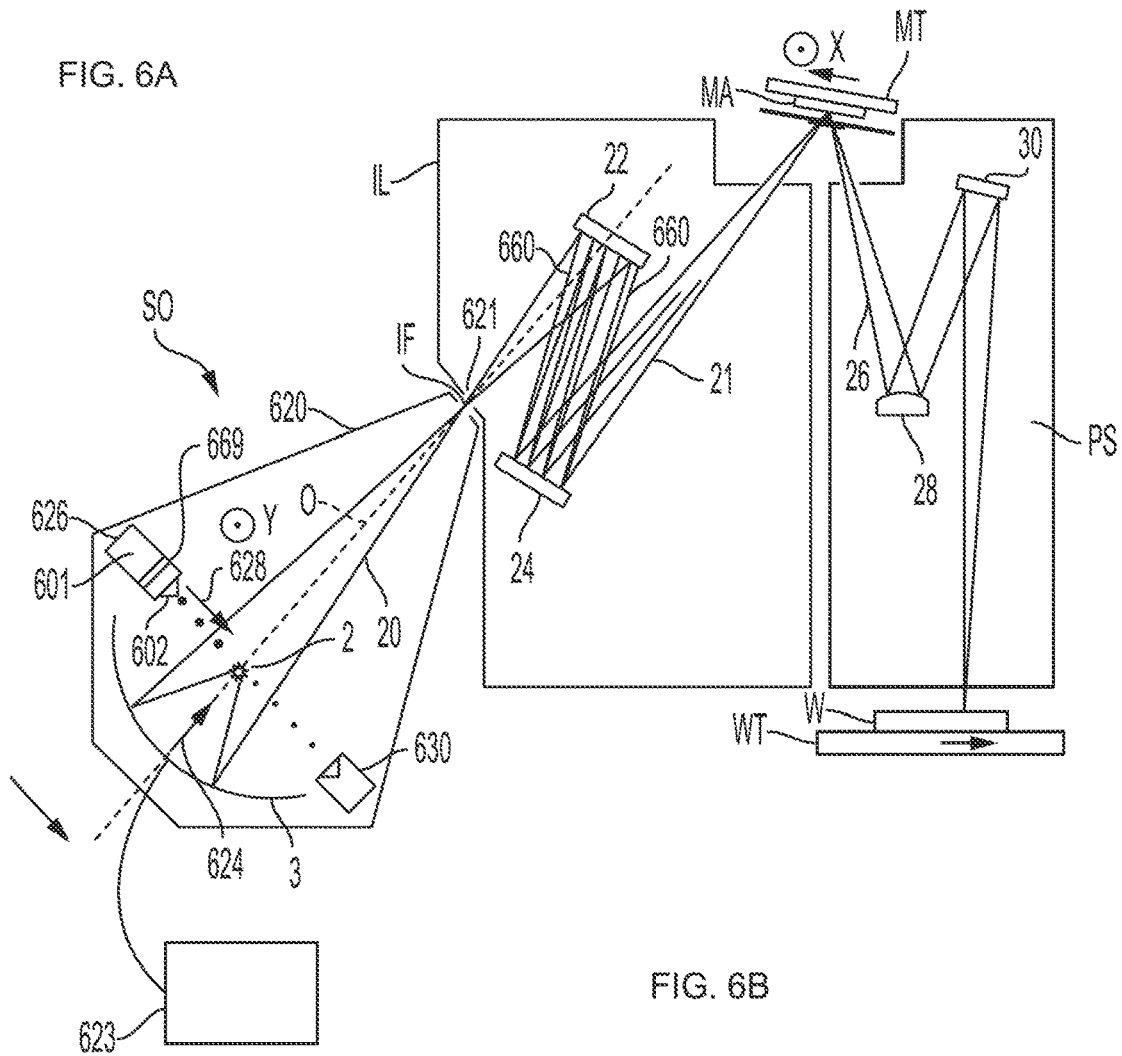

FIGS. 6A and 6B are block diagrams of an example of a lithographic apparatus.

Figure 7:
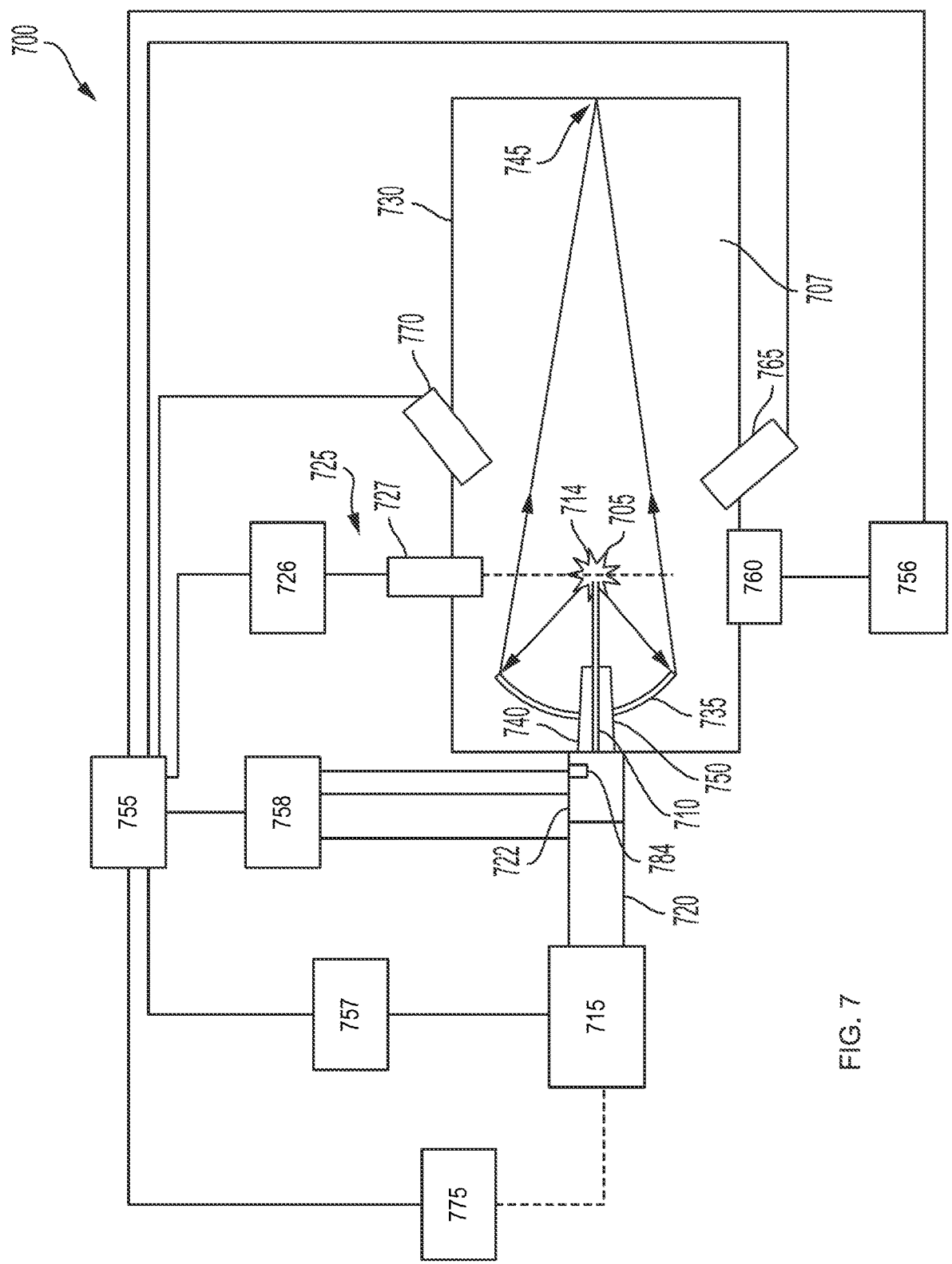

FIG. 7 is a block diagram of an example of an EUV light source.

DETAILED DESCRIPTION

Figure 1:
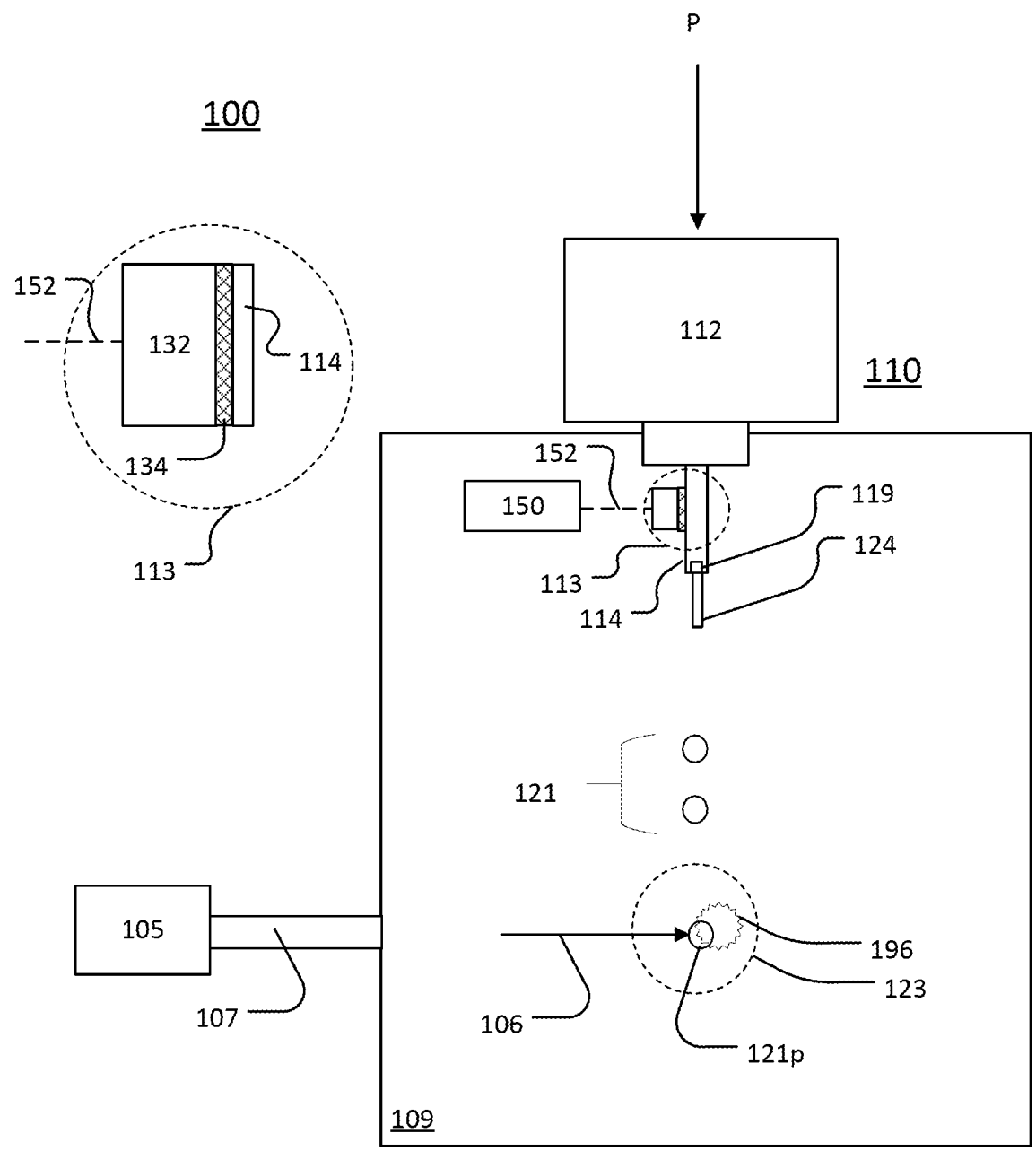
FIG. 1 is a block diagram of an example of an EUV light source.

Referring to FIG. 1, a block diagram of an EUV light source 100 that includes a supply system 110 is shown. The supply system 110 emits a stream of targets 121 such that a target 121p is delivered to a plasma formation location 123 in a vacuum chamber 109. The target 121p includes target material, which is any material that emits EUV light when in a plasma slate. For example, the target material may include water, tin, lithium, and/or xenon. The plasma formation location 123 receives a light beam 106. The light beam 106 is generated by an optical source 105 and delivered to the vacuum chamber 109 via an optical path 107. An interaction between the light beam 106 and the target material in the target 121p produces a plasma 196 that emits EUV light.

The supply system 110 includes a capillary tube 114 that is fluidly coupled to a reservoir 112. The capillary tube 114 defines an orifice 119. A region 113 (outlined by a dashed line in FIG. 1) that encompasses a portion of the capillary tube 114 is shown in greater detail in the inset. The region 113 is not a physical structure within the vacuum chamber 109 but is instead used to label a portion of the supply system 110 that is shown in greater detail.

The capillary tube 114 is mechanically coupled to an actuator 132 by an adhesive 134 (shown with cross-hatch shading in FIG. 1). The actuator 132 is coupled to a control system 150 via a control link 152. The control system 150 may include a function generator, an electronic processor (not shown), and an electronic storage (not shown) to carry out the functions of the control system 150. The control link 152 is any type connection capable of transmitting data from the control system 150 to the actuator 132. For example, the control link 152 may be a wired and/or wireless connection configured to transmit electronic signals and commands from the control system 150 to the actuator 132. The control system 150 generates signals that, when applied to the actuator 132 or to an element associated with the actuator 132, cause the actuator 132 to move. For example, the actuator 132 may be a piezoelectric ceramic material that changes shape based on an applied voltage. In these implementations, the control system 150 generates signals that are delivered to a voltage source (not shown) that applies voltages to the actuator 132. The magnitude and/or polarity of the voltage applied to the actuator 132 is based on the signals from the control system 150. Due to the mechanical coupling between the capillary tube 114 and the actuator 132, when the actuator 132 moves or vibrates, the capillary tube 114 experiences a corresponding motion or vibration. Maintaining the mechanical coupling between the actuator 132 and the capillary tube 114 is important to achieving proper and robust operation of the EUV light source 100.

The adhesive 134 is any type of adhesive that occupies a volume that remains substantially the same or increases as a result of the curing process. For example, the adhesive 134 may be a benzoxazine resin or a cyanate ester resin. Curing is a process by which a chemical reaction (such as polymerization) or a physical action (such as evaporation, healing, or cooling) converts an adhesive material from an un-cured state to a cured state. The cured state of an adhesive material is generally harder, stronger, and/or more stable than the un-cured state of the adhesive material. For example, in the cured state, the adhesive is able to permanently bond two items, whereas joining two items with an uncured adhesive does not permanently bond the two items to each other. The uncured state of an adhesive is, for example, a liquid, and the cured state is generally a solid. The gel point of an adhesive is the point at which the adhesive begins to transition to a solid. More specifically, the gel point is a point where adhesive may still be uncured and relatively soft, but it stops to change its shape through the flow. The adhesive may continue to harden and cure after passing through the gel point.

Known supply systems for EUV light sources use adhesives (such as, for example, high temperature epoxies, or bismaleimide-based adhesives) that shrink (or reduce in volume) as a result of the curing process to bond the capillary tube 114 to the actuator 132. Such adhesives have a tendency to delaminate during use. Delamination is the direct consequence of the large tensile stress that is induced in the adhesive layer by the cure shrinkage. When an adhesive delaminates, it separates into layers and/or detaches from an item or items to which the adhesive was intentionally bonded. The delamination results in a weakening or loss of the mechanical coupling between the PZT actuator and the nozzle capillary bonded by the adhesive.

On the other hand, curing does not cause a net shrink of the adhesive 134. The physical properties of the adhesive 134, particularly the characteristics related to a stable or expanding volume due to curing or as a result of the curing process or during curing, eliminate or reduce the occurrence of delamination during use of the supply system 110. Using the adhesive 134 in the supply system 110 leads to a more robust mechanical coupling between the actuator 132 and the capillary tube 114, thereby providing an overall improvement in performance of the EUV source 100. Before discussing the adhesive 134 in greater detail, an overview of the operation of the supply system 110 is provided.

The reservoir 112 contains target material under pressure P. The target material is in a molten state and is able to flow, and the pressure in the vacuum chamber 109 is lower than the pressure P. Thus, the target material flows through the capillary tube 114 and is emitted into the chamber 109 through the orifice 119. The target material exits the orifice 119 as a jet or continuous stream 124 of target material. The jet of target material breaks up into individual droplets. The break-up of the jet 124 may be controlled such that the individual droplets coalesce into larger droplets that arrive at the plasma formation location 123 at a desired rate by vibrating the capillary tube 114. For example, the control system 150 may provide a signal that has at least a first frequency and a second frequency via the control link 152 to thereby drive the actuator 132 to vibrate at the first and second frequencies. The first frequency may be in the megahertz (MHz) range. Vibrating the capillary tube 114 at the first frequency causes the jet 124 to break into relatively small targets of desired sizes and speeds. The second frequency is lower than the first frequency. For example, the second frequency may be in the kilohertz (kHz) range. The second frequency is used to modulate the velocity of the targets in the stream and to encourage target coalescence. Driving the capillary tube 114 at the second frequency causes groups of targets to form. In any given group of targets, the various targets travel at different velocities. The targets with higher velocities may coalesce with the targets with lower velocities to form larger coalesced targets that make up the stream of targets 121. These larger targets are separated from each other by a larger distance than the non-coalesced droplets. The larger separation helps to mitigate the influence of the plasma formed from one target on the trajectory of the subsequent targets in the stream 121. The targets in the stream of targets 121 may be approximately spherical, with a diameter of about 30 μm.

By causing the capillary tube 114 to vibrate in this manner, targets may be generated at frequencies of, for example, between 40 to 300 kHz and may travel toward the plasma formation location 123 at a velocity of, for example, between 40 and 120 meters per second (m/s) or up to 500 m/s. The spatial separation between two adjacent targets in the stream of targets 121 may be, for example, between 1 and 3 millimeters (mm). Between 50 and 300 initial droplets (also called Rayleigh droplets) may coalesce to form a single larger target.

Thus, the motion of the capillary tube 114 is controlled to encourage coalescence of target material and to control the rate of target production. The motion of the capillary tube 114 corresponds to the motion of the actuator 132 as long as a good mechanical coupling between the actuator 132 and the capillary tube 114 is maintained. As such, maintaining the mechanical coupling between the actuator 132 and the capillary lube 114 is important to ensuring that the production of targets is carried out as intended and that the EUV light source 100 generates EUV light at an expected rate. The adhesive 134 improves the mechanical coupling between the capillary tube 114 and the actuator 132.

Figure 2:
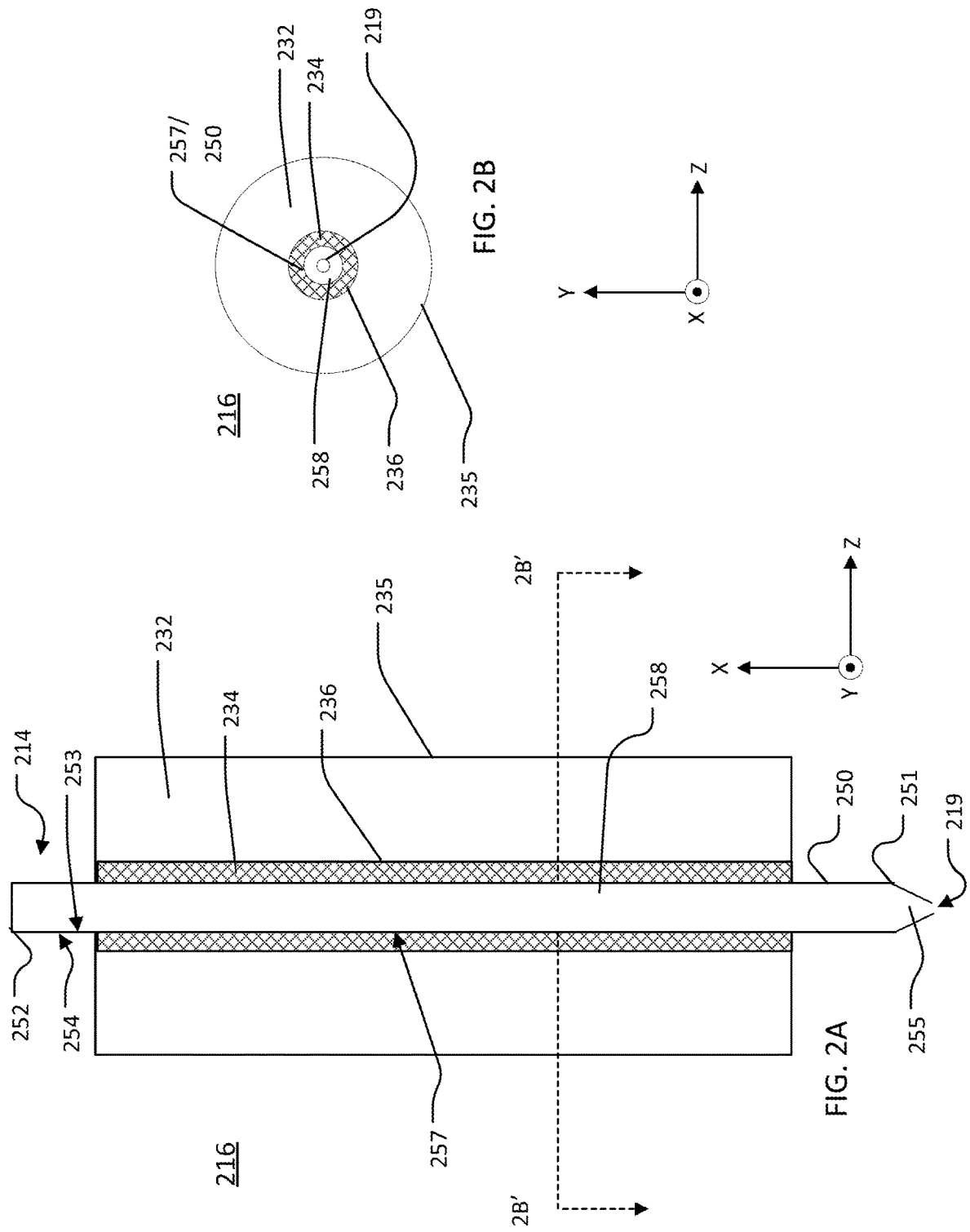
FIG. 2A is a side cross-sectional view of an example of a target formation apparatus.
FIG. 2B is a top cross-sectional view of the target formation apparatus of FIG. 2A.

FIG. 2A is a side cross-sectional view of a target formation apparatus 216 in an X-Z plane. FIG. 2B is a top cross-sectional view of the target formation apparatus 216 in a Y-Z plane taken along the line 2B'-2B' of FIG. 2A.

The target formation apparatus 216 may be used in the EUV light source 100 (FIG. 1) in place of the capillary tube 114, the actuator 132, and the adhesive 134. The target formation apparatus 216 includes a capillary tube 214 that is mechanically coupled to an actuator 232 by an adhesive 234 (shown in cross-hatch shading). The adhesive 234 is any type of adhesive that expands or remains the same volume due to curing. For example, the adhesive 234 may be a benzoxazine resin, a resin containing benzoxazines, a cyanate ester resin, or a resin containing cyanate esters.

The capillary tube 214 includes a sidewall 250 that extends along the X direction from a first end 251 to a second end 252. The sidewall 250 is a three-dimensional object that is generally cylindrical. The sidewall 250 includes an inner surface 253 and an outer surface 254. The inner surface 253 defines an interior region 258 (FIG. 2B) that is in fluid communication with a nozzle 255 at the first end 251. The nozzle 255 narrows along the −X direction to define an orifice 219. In operational use, the interior region 258 is fluidly coupled to a reservoir of target material (such as the reservoir 112 of FIG. 1), and molten target material flows in the interior region 258 of the capillary tube 214 and through the orifice 219 in the −X direction.

In the example of FIGS. 2A and 2B, the actuator 232 is a cylinder with an outer actuator surface 235 and an inner actuator surface 236. The inner actuator surface 236 defines an open central region that extends along the X direction. The inner actuator surface 236 completely surrounds a portion 257 (FIG. 2A) of the outer surface 254. The portion 257 includes any part of the outer surface 254 that is surrounded by the actuator 232. The portion 257 may extend from the first end 251 to the second end 252, or the portion 257 may extend along the X direction over less than the entire length of the sidewall 250. In the example of FIG. 2A, the portion 257 extends in the X direction over less than the entire length of the sidewall 250.

The actuator 232 is made of any material that is capable of causing the sidewall 250 to move. For example, the actuator 232 may be a piezoelectric ceramic material such as lead zirconate titanate (PZT) that changes shape in response to the application of voltage. By changing shape, the PZT also causes the capillary tube 214 to move. The actuator 232 may cause the capillary tube 214 to move by vibrating, translating, squeezing, or any other form of motion.

The actuator 232 is mechanically coupled to the portion 257 with the adhesive 234. The adhesive 234 occupies the space between the portion 257 of the outer surface 254 and the actuator 232. The adhesive 234 is intended to completely fill the space and to make physical contact with all of the portion 257 and with the actuator 232. As such, the adhesive 234 forms a mechanical coupling between the potion 257 of the outer surface 254 and the actuator 232. Due to the physical properties of the adhesive 234, the adhesive 234 remains in contact with the portion 257 and the actuator 232 during operational use of the target formation apparatus 216, as discussed in more detail with respect to FIGS. 3 and 4.

Referring to FIG. 3, a flow chart of an example of a process 300A for fabricating the target formation apparatus 216 and a flow chart of an example of a process 300B for operating the target formation apparatus 216 are shown. The processes 300A and 300B are discussed with respect to the target formation apparatus 216 of FIGS. 2A and 2B. However, the process 300A may be used to fabricate other target formation apparatuses that include an adhesive such as the adhesive 234, and the process 300B may be used to operate other target formation apparatuses that include an adhesive such as the adhesive 234.

The actuator 232 and the capillary tube 214 are positioned relative to each other (310). For example, the capillary tube 214 is inserted into the open region defined by the inner actuator surface 236. The actuator 232 and the capillary tube 214 are mechanically coupled to each other with an adhesive that does not shrink as a result of curing (320). To mechanically couple the actuator 232 and the capillary tube 214 to each other, the adhesive is placed in the space between the inner actuator surface 236 and the portion 257. The adhesive 234 is initially uncured (for example, in liquid form). The adhesive 234 is cured by heating the adhesive 234 at least to the gel point and may be heated to temperatures above the gel point. The curing temperature and the temperature of the gel point depend on the chemical composition of the adhesive and may be, for example 100-140 degrees (°) Celsius (C) and up to 300 degrees Celsius.

The volume of the adhesive 234 expands or does not change as a result of the curing process. This is in contrast to adhesives used in traditional target formation apparatuses. The adhesives used to couple a capillary tube to an actuator in a traditional target formation apparatus are adhesives that shrink (reduce in volume) due to the curing process. In the discussion below, an adhesive that shrinks as a result of curing is referred to as a traditional adhesive. Examples of such traditional high temperature capable adhesives include, for example, epoxies, silicone elastomers, polyimides, bismaleimides, and vinyl esters. When the temperature of the traditional adhesive reaches the gel point, the traditional adhesive begins to solidify and shrink. The traditional adhesive is confined between the surfaces of the capillary tube and the actuator. Thus, when the traditional adhesive shrinks, a tensile stress is generated in the adhesive. Stress is the average force per unit area that a body exerts on an adjacent body, and a tensile stress is a lengthening or stretching stress. After curing, a tensile stress may be present in the traditional adhesive. This tensile stress tends to stretch out the traditional adhesive and may cause the traditional adhesive to pull apart. Thus, the presence of the tensile stress may destroy the mechanical coupling between the capillary tube and the actuator or lead to the formation of a weaker-than-ideal mechanical coupling that is prone to delamination during operational use. Delamination during operational use may lead to target coalescence that is less than optimal and stray satellite droplets. Additionally, the delamination may be spatially non-uniform. For example, the delamination may occur only on one side or only in one area. This may cause produced targets to be off-axis, that is, to not travel along the expected path to the plasma formation region 123.

In contrast, the adhesive 234 expands or does not change in volume due to curing. In other words, the adhesive 234 does not shrink due to curing. The adhesive 234 is confined between the capillary tube 214 and the actuator 232. Thus, when the adhesive 234 cures, instead of a tensile stress, a compressive stress arises in the adhesive 234. A compressive stress is along a direction that is opposite to a direction of a corresponding tensile stress. The compressive stress in the adhesive 234 encourages a mechanical coupling between the portion 257 and the actuator 232, and the compressed adhesive 234 is less likely to tear apart or separate.

After the adhesive 234 has cured, the target formation apparatus 216 is cooled to room temperature. The actuator 232 and the capillary tube 214 are made from different materials and have different coefficients of thermal expansion (CTE). For example, the capillary tube 214 may be made of quartz (which has a CTE of about $0.5 \times 10^{-6}/C°$), and the actuator 232 may be a piezoelectric ceramic material, such as PZT (which has a CTE of about 5 to $8 \times 10^{-6}/C°$). Thus, when heated or cooled, the dimensions of the capillary tube 214 and the actuator 232 change by different amounts. When the target formation apparatus 216 cools to room temperature, the diameter of the inner actuator surface 236 decreases faster than the diameter of the portion 257. As such, cooling the target formation apparatus 216 to room temperature results in the inner actuator surface 236 pressing the adhesive 234 toward the portion 257, thereby applying a further compressive stress that encourages mechanical coupling between the actuator 232 and the portion 257.

If a traditional adhesive that shrinks as a result of curing was used instead of the adhesive 234, the inner actuator surface 236 would still press the traditional adhesive toward the capillary tube 214. However, the tensile stress in the traditional adhesive from curing would counteract the compressive stress applied by the inner actuator surface 236.

On the other hand and as discussed above, using the adhesive 234 achieves a total stress that is compressive overall. The presence of an overall compressive stress encourages the mechanical connection between the capillary tube 214 and the actuator 232 and makes it less likely that partial or complete delamination will occur. Accordingly, using the adhesive 234 instead of the adhesives that are traditionally used in target formation apparatuses results in the target formation apparatus 216 being more robust than a traditional target formation apparatus.

After the process 300A is completed, the target formation apparatus 216 is ready to be stored, shipped, and/or installed in an EUV light source. The process 300B is performed after the target formation apparatus 216 is installed in an EUV light source, such as the EUV light source 100 of FIG. 1. The process 300B is discussed with reference to the EUV light source of FIG. 1 and the target formation apparatus 216 of FIGS. 2A and 2B.

When installed in the EUV light source, the target formation apparatus 216 is arranged such that the interior region 258 of the capillary tube 214 is in fluid communication with the target material in the reservoir 112 (FIG. 1), and the orifice 219 is inside the vacuum chamber 109. The target material flows through the interior region 258 (330). For example, applying the pressure P to the target material in the reservoir 112 causes the target material to flow through the interior region 258. The target material is emitted from the orifice 219.

The motion of the capillary tube 214 is controlled (340). For example, die actuator 232 is connected to the control system 150 via the control link 152, and the control system 150 controls a magnitude of voltage applied and/or a polarity of voltage applied to the actuator 232 to control the motion of the actuator 232. In some implementations, the control system 150 causes the actuator 232 to vibrate at a first and second frequency to encourage coalescence of the target material and control the rate of targets at the plasma formation location 123.

The target material is typically molten metal and has a temperature that is much higher than room temperature. As the target material moves through the interior region 258, the temperature of the capillary tube 214, the portion 257, the adhesive 234, and the actuator 232 should also be maintained above the melting point of the target material. Under typical operating conditions, the temperature of the adhesive 234 may increase to about 250° C. The operational temperature of the target formation apparatus 216 may be greater than the curing temperature of the adhesive 234.

As discussed above, the capillary tube 214 and the actuator 232 are made from different materials that have different coefficients of thermal expansion. Thus, the capillary tube 214 and the actuator 232 expand by different amounts as they are heated to the operating temperature. For example, the actuator 232 expands radially outward more quickly than the capillary tube 214. This causes the actuator 232 to pull on the adhesive 234, thereby increasing the tensile stress in the adhesive. However, this tensile stress is compensated by the compressive stress in the adhesive 234. Thus, the adhesive 234 does not delaminate during operational use of the target formation apparatus 216.

This is in contrast to a traditional target formation apparatus that uses an adhesive that shrinks as a result of the curing process. As discussed above, the adhesives traditionally used in target formation apparatuses shrink as a result of the curing process and generate a relatively large tensile stress instead of a compressive stress. As such, when a traditional target formation apparatus is heated during operational use, the additional tensile stress arising from the mismatch in the coefficient of thermal expansion between the materials is not compensated by a compressive stress in the adhesive layer. Instead, the tensile stress dominates and the traditional adhesive is more likely to delaminate than the adhesive 234.

Accordingly, the adhesive 234 remains in contact with the portion 257 and the actuator 232 during operational use such that the adhesive 234 provides a robust mechanical coupling between the portion 257 and the actuator 232. As such, using the adhesive 234 instead of an adhesive traditionally used to fabricate a target formation apparatus results in the target formation apparatus 216 being more robust and improves the performance of an EUV light source that includes the target formation apparatus 216.

FIGS. 4, 5A, 5B, and 5C show experimental results related to the adhesive 234. The mechanical coupling between the actuator and capillary tube of a target formation apparatus may be assessed by analyzing the impedance of the target formation apparatus as a function of frequency.

Figure 4:
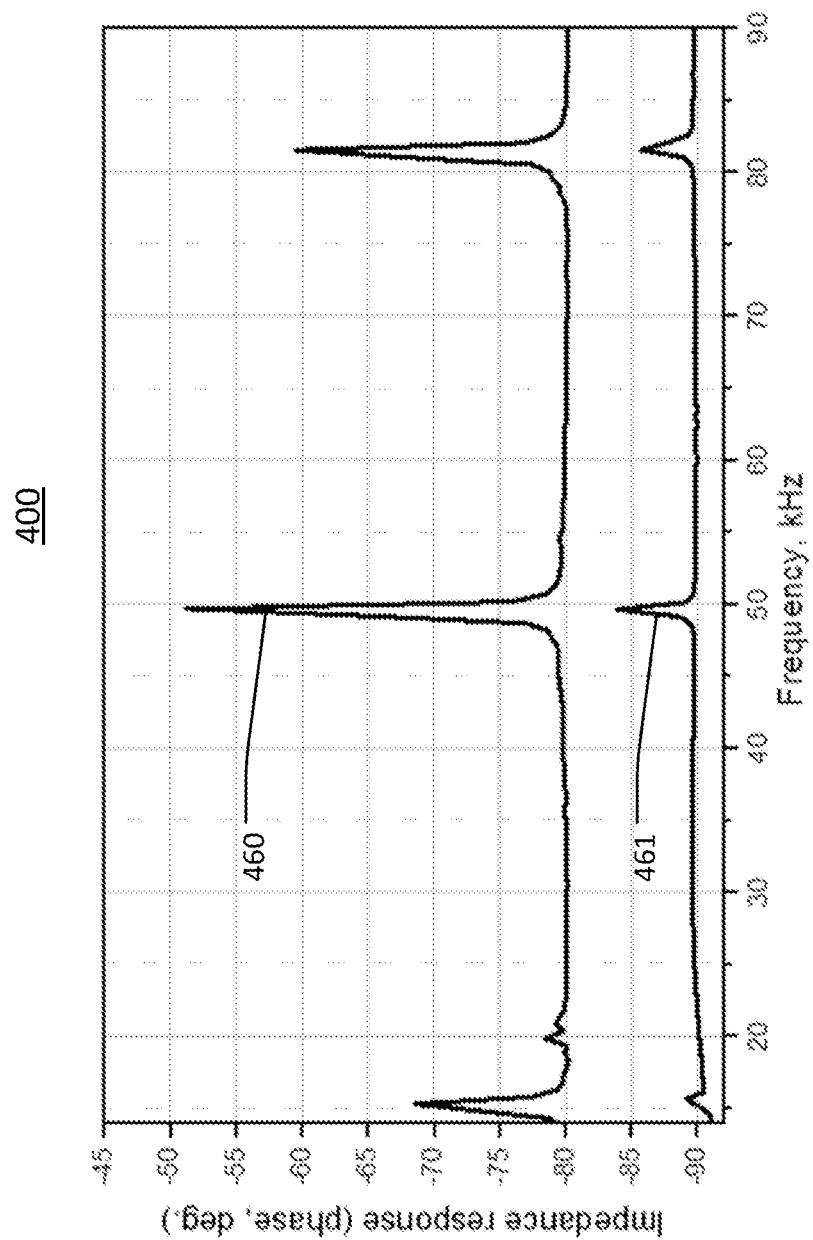

FIG. 4 is a graph 400 that compares a measured impedance response of a target formation apparatus in which a capillary tube was coupled to an actuator with a cyanate ester adhesive to a measured impedance response of a target formation apparatus in which a typical adhesive (bismaleimide adhesive in this case) was used to couple the actuator to the capillary tube. The response of the target formation apparatus that uses cyanate ester is labeled 460. The response of the target formation apparatus that uses the traditional adhesive is labeled 461. The cyanate ester adhesive does not shrink due to curing, whereas the traditional adhesive shrinks due to curing. Other than using different adhesives, the target formation apparatus used to generate the data labeled 460 was the same as the target formation apparatus used to generate the data labeled 461.

The impedance response is the phase of the impedance of the target formation apparatus in degrees as a function of frequency in kilohertz (kHz). An ideal target formation apparatus in which the mechanical connection between the capillary tube and the actuator is robust has an impedance response with strong (relatively high amplitude) peaks at the resonant frequency or frequencies of the target formation apparatus. When the mechanical coupling between the capillary tube and the actuator deteriorates, the value of the impedance response at the resonant frequency or frequencies is reduced.

In FIG. 4, the impedance response 460 has strong peaks at three resonant frequencies, with the largest peak having a magnitude of about 28 degrees at about 51 kHz (the impedance response curves are offset in the plot for clarity by 10 degrees). In contrast, the largest peak of the impedance response 461 has a magnitude of only 7 degrees at the same frequency. Thus, the peak in the impedance response 461 is significantly lower compared to the peak in the impedance response 460. This result indicates that the cyanate ester provides better mechanical coupling between the actuator and the capillary tube.

Figure 5A:
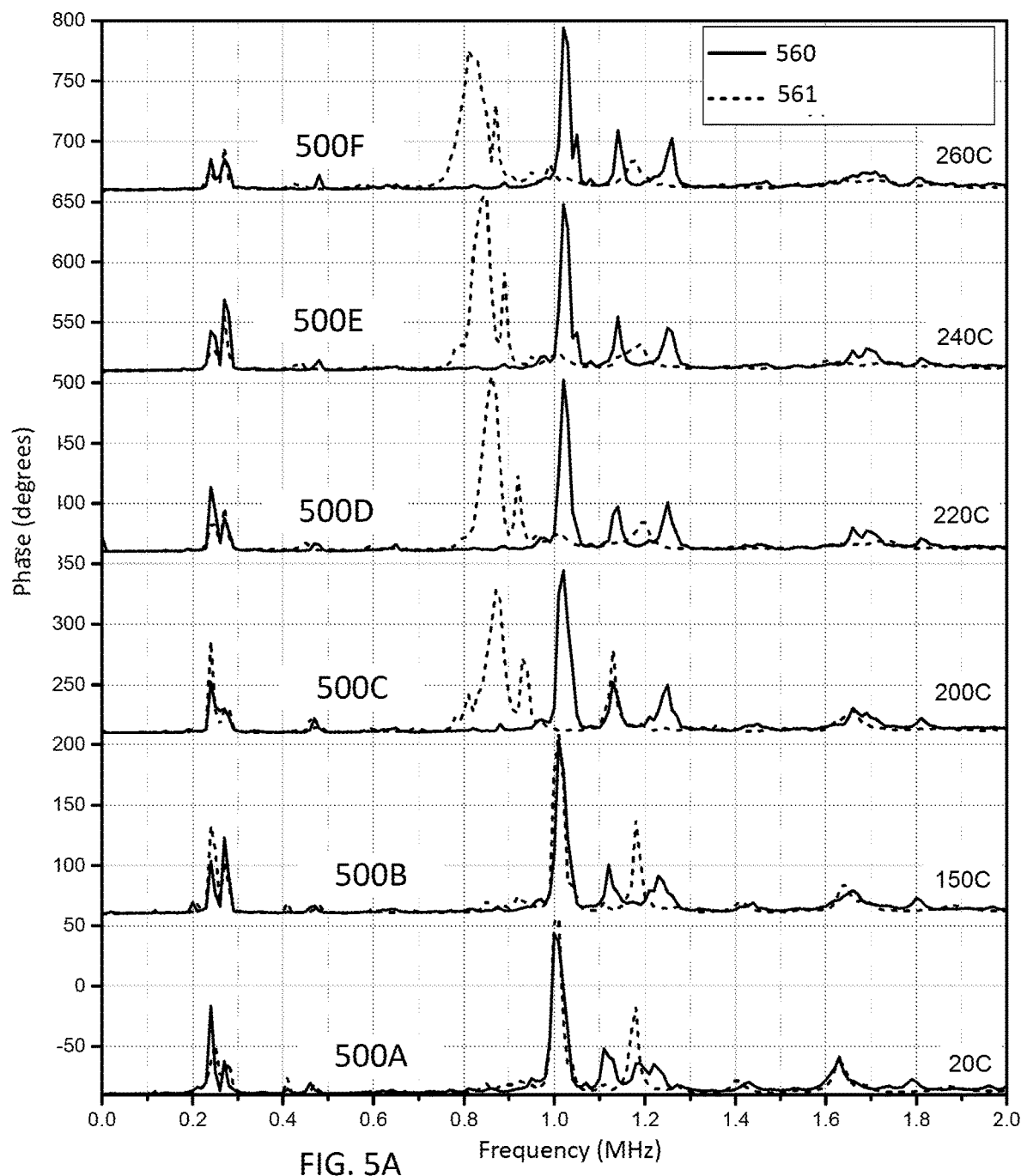

FIG. 5A includes six impedance graphs 500A-500F. Each impedance graph 500A-500F includes a measured impedance response (phase) from two different target formation apparatuses at 20° C., 150° C., 200° C., 220° C. 240° C. and 260° C., respectively. The data plotted with the dashed line style (561) represents data from a target formation apparatus in which a traditional adhesive was used to bond a glass capillary tube to a PZT actuator. The data plotted with the solid line style (560) represents data from the same target formation apparatus except a cyanate ester adhesive that does not shrink as a result of curing was used to bond the glass capillary tube to the PZT actuator. The plots in FIG. 5A obtained at different temperature are offset vertically by 150 degrees in phase for clarity.

The most prominent feature in the plots shown in FIG. 5A is the hoop mode peak that appears approximately at a frequency of 1 MHz for both target formation apparatuses at room temperature (at a temperature of 20° C.). The hoop mode is a mode in which the tube that forms the PZT actuator vibrates along the radial direction. The frequency of the peak of the hoop mode changes if the adhesive delaminates because the effective stiffness of the PZT tube is different depending on whether it is rigidly attached to the capillary tube or not. Thus, measuring the frequency of the hoop mode peak is another way to gage the robustness of the mechanical coupling between the capillary tube and the PZT tube.

As shown in FIG. 5A, the peak of the hoop mode impedance in the target formation apparatus that uses the typical adhesive (561) shifts to a lower frequency as the temperature increases. This shift is due to a delamination of the adhesive that is caused by the tensile stress that originates in the CTE mismatch between the glass capillary tube and the PZT material and the tensile stress due to the traditional adhesive shrinking as a result of curing. On the other hand, the peak of the hoop mode impedance in the target formation apparatus that uses the cyanate ester adhesive (560) was substantially the same in all of the impedance graphs 500A-500F. This indicates that the cyanate ester adhesive did not delaminate as the temperature was increased.

FIG. 5B shows eight impedance graphs 501A-501H for a target formation apparatus in which a cyanate ester adhesive known as AroCy® XU371 adhesive (available from Huntsman Advanced Materials Americas LLC of the Woodlands, Tex.) was used to bond a glass capillary tube to a PZT actuator. Each impedance graph 501A-501H shows the measured impedance response of the target formation apparatus between 45 kHz and 55 kHz during a different run of the target formation apparatus. Each run was performed at a different time.

The impedance graph 501A shows the impedance response measured during the initial run (the first or initial use) of the target formation apparatus while the target formation apparatus was heated to about 250° C. and pressurized to about 3,000 pounds per square inch (psi). After the initial run, the target formation apparatus was shut down by being depressurized and cooled to room temperature. The target formation apparatus was again heated to operating temperature and pressurized to perform a second run. The impedance response shown in the impedance graph 501B was measured during the second run and while the target formation was heated and pressurized. After the second run, the target formation apparatus was again cooled to room temperature and depressurized. The impedance graphs 501C-501H show impedance responses measured during subsequent runs.

As shown in FIG. 5B, the frequency at which the peak of the impedance response occurs is substantially the same during each run and the amplitude of the peak is substantially the same, indicating that the AroCy® XU371 adhesive did not delaminate despite repeated temperature and pressure cycling.

FIG. 5C shows hoop mode data 502A-502H for a target formation apparatus that uses the AroCy® XU371 adhesive to bond a glass capillary tube to a PZT actuator. The hoop mode data 502A-502H was taken under the same conditions as the data in FIG. 5B. For example, the hoop mode data 502A shows the measured hoop mode impedance for the initial run, the hoop mode data 502B shows the measured hoop mode impedance for the second run, and each of the hoop mode data 502C-502h shows the measured hoop mode impedance for one of the subsequent runs. The hoop mode data 501A-502H shows that the frequency at which the peak of the hoop mode occurs does not vary from run-to-run. This provides further evidence that the AroCy® XU371 adhesive did not delaminating despite repeated temperature and pressure cycling.

The target formation apparatus used to collect the data in FIG. 5A had different characteristics than those shown in FIGS. 5B, C. For example, the target formation apparatus used to collect the data in FIG. 5A had a PZT tube with a thicker wall. Thus, the frequency of the hoop mode peak in impedance response is different for each of these two target formation apparatus under the same operating conditions. However, the data shown in FIGS. 5A-5C demonstrates that using an adhesive that does not shrink as a result of curing reduces occurrence of delamination.

FIG. 6A is a block diagram of a lithographic apparatus 600 that includes a source collector module SO. The lithographic apparatus 600 includes:
- an illumination system (illuminator) IL configured to condition a radiation beam B (for example, EUV radiation).
- a support structure (for example, a mask table) MT constructed to support a patterning device (for example, a mask or a reticle) MA and connected to a first positioner PM configured to accurately position the patterning device;
- a substrate table (for example, a wafer table) WT constructed to hold a substrate (for example, a resist-coated wafer) W and connected to a second positioner PW configured to accurately position the substrate; and
- a projection system (for example, a reflective projection system) PS configured to project a pattern imparted to the radiation beam B by patterning device MA onto a target portion C (for example, including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that may be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

In the example of FIGS. 6A and 6B, the apparatus is of a reflective type (for example, employing a reflective mask). The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 6A, the illuminator IL receives an extreme ultraviolet radiation beam from the source collector module SO. Methods to produce EUV light include, but are not necessarily limited to, converting a material into a plasma state that has at least one element, for example, xenon, lithium or tin, with one or more emission lines in the EUV range. In one such method, often termed laser produced plasma ("LPP") the required plasma is produced by irradiating a fuel, such as a droplet, stream or cluster of material having the required line-emitting element, with a laser beam. The source collector module SO may be part of an EUV radiation system including a laser, not shown in FIG. 6A, for providing the laser beam exciting the fuel. The resulting plasma emits output radiation, for example, EUV radiation, which is collected using a radiation collector, disposed in the source collector module. The laser and the source collector module may be separate entities, for example when a carbon dioxide ($CO_2$) laser is used to provide the laser beam for fuel excitation.

In such cases, the laser is not considered to form part of the lithographic apparatus and the radiation beam is passed from the laser to the source collector module with the aid of a beam delivery system including, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as facetted field and pupil mirror devices. The illuminator IL may be used to condition the radiation beam, to have a desired uniformity and intensity distribution in its cross-section.

The radiation beam B is incident on the patterning device (for example, mask) MA. which is held on the support structure (for example, mask table) MT, and is patterned by the patterning device. After being reflected from the patterning device (for example, mask) MA, the radiation beam B passes through the projection system PS, which focuses the beam onto a target portion C of the substrate W. With the aid of the second positioner PW and position sensor PS2 (for example, an interferometric device, linear encoder or capacitive sensor), the substrate table WT can be moved accurately, for example, so as to position different target portions C in the path of the radiation beam B. Similarly, the first positioner PM and another position sensor PS1 can be used to accurately position the patterning device (for example mask) MA with respect to the path of the radiation beam B. Patterning device (for example mask) MA and substrate W may be aligned using patterning device alignment marks M1, M2 and substrate alignment marks P1, P2.

The depicted apparatus may be used in at least one of the following modes:
1. In step mode, the support structure (for example, mask table) MT and the substrate table WT are kept essentially stationary, while an entire pattern imparted to the radiation beam is projected onto a target portion C at one time (that is, a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam is projected onto a target portion C (that is, a single dynamic exposure). The velocity and direction of the substrate table WT relative to the support structure (for example, mask tablet MT may be determined by the (de-)magnification and image reversal characteristics of the projection system PS.
3. In another mode, the support structure (for example, mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 6B shows an implementation of the lithographic apparatus 600 in more detail, including the source collector module SO, the illumination system IL, and the projection system PS. The source collector module SO is constructed and arranged such that a vacuum environment can be maintained in an enclosing structure 620 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 621 in the enclosing structure 620. The virtual source point IF is an image of the radiation entitling plasma 2.

From the aperture 621 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA (as shown by reference 660). Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to enclosing structure 620. More elements than shown may generally be preset in illumination system IL and projection system PS. Further, there may be more mirrors present than those shown. For example there may be one to six additional reflective elements present in the illumination system IL and/or the projection system PS, besides those shown in FIG. 6B.

Considering source collector module SO in more detail, a laser energy source including a laser 623 is arranged to deposit laser energy 624 into a fuel that includes a target material. The target material may be any material that emits EUV radiation in a plasma state, such as xenon (Xe), tin (Sn), or lithium (Li). The plasma 2 is a highly ionized plasma with electron temperatures of several 10's of electron volts (eV). Higher energy EUV radiation may be generated with other fuel materials, for example, terbium (Tb) and gadolinium (Gd). The energetic radiation generated during de-excitation and recombination of these ions is emitted from the plasma, collected by a near normal incidence collector 3 and focused on the aperture 621. The plasma 2 and the aperture 621 are located at first and second focal points of collector CO, respectively.

Although the collector 3 shown in FIG. 6B is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another.

To deliver the fuel, which, for example, is liquid tin, a droplet generator 626 is arranged within the enclosure 620, arranged to fire a high frequency stream 628 of droplets towards the desired location of plasma 2. The droplet generator 626 may be the target formation apparatus 216 and/or includes an adhesive such as the adhesive 234. In operation, laser energy 624 is delivered in a synchronism with the operation of droplet generator 626, to deliver impulses of radiation to turn each fuel droplet into a plasma 2. The frequency of delivery of droplets may be several kilohertz, for example 50 kHz. In practice, laser energy 624 is delivered in at least two pulses: a pre pulse with limited energy is delivered to the droplet before it reaches the plasma location, in order to vaporize the fuel material into a small cloud, and then a main pulse of laser energy 624 is delivered to the cloud at the desired location, to generate the plasma 2. A trap 630 is provided on the opposite side of the enclosing structure 620, to capture fuel that is not, for whatever reason, turned into plasma.

The droplet generator 626 comprises a reservoir 601 which contains the fuel liquid (for example, molten tin) and a filter 669 and a nozzle 602. The nozzle 602 is configured to eject droplets of the fuel liquid towards the plasma 2 formation location. The droplets of fuel liquid may be ejected from the nozzle 602 by a combination of pressure within the reservoir 601 and a vibration applied to the nozzle by a piezoelectric actuator (not shown).

As the skilled reader will know, reference axes X, Y, and Z may be defined for measuring and describing the geometry and behavior of the apparatus, its various components, and the radiation beams 20, 21, 26. At each part of the apparatus, a local reference frame of X, Y and Z axes may be defined. In the example of FIG. 6B, the Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 628, while the Y axis is orthogonal to that, pointing out of the page as indicated in FIG. 6. On the other hand, in the vicinity of the support structure MT that holds the reticle MA, the X axis is generally transverse to a scanning direction aligned with the Y axis. For convenience, in this area of the schematic diagram FIG. 6B, the X axis points out of the page, again as marked. These designations are conventional in the art and will be adopted herein for convenience. In principle, any reference frame can be chosen to describe the apparatus and its behavior.

Numerous additional components used in the operation of the source collector module and the lithographic apparatus 500 as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus 600.

Referring to FIG. 7, an implementation of an LPP EUV light source 700 is shown. The light source 700 may be used as the source collector module SO in the lithographic apparatus 600. Furthermore, the optical source 105 of FIG. 1 may be part of the drive laser 715. The drive laser 715 may be used as the laser 623 (FIG. 6B).

The LPP EUV light source 700 is formed by irradiating a target mixture 714 at a plasma formation location 705 with an amplified light beam 710 that travels along a beam path toward the target mixture 714. The target material discussed with respect to FIGS. 1, 2A, 2B, and 3, and the targets in the stream 121 discussed with respect to FIG. 1 may be or include the target mixture 714. The plasma formation location 705 is within an interior 707 of a vacuum chamber 730. When the amplified light beam 710 strikes the target mixture 714, a target material within the target mixture 714 is converted into a plasma state that has an element with an emission line in the EUV range. The created plasma has certain characteristics that depend on the composition of the target material within the target mixture 714. These characteristics may include the wavelength of the EUV light produced by the plasma and the type and amount of debris released from the plasma.

The light source 700 also includes the supply system 725 that delivers, controls, and directs the target mixture 714 in the form of liquid droplets, a liquid stream, solid particles or clusters, solid particles contained within liquid droplets or solid particles contained within a liquid stream. The target mixture 714 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 714 may also include impurities such as non-target particles. Thus, in the situation in which there are no impurities, the target mixture 714 is made up of only the target material. The target mixture 714 is delivered by the supply system 725 into the interior 707 of the chamber 730 and to the plasma formation location 705.

The light source 700 includes a drive laser system 715 that produces the amplified light beam 710 due to a population inversion within the gain medium or mediums of the laser system 715. The light source 700 includes a beam delivery system between the laser system 715 and the plasma formation location 705, the beam delivery system including a beam transport system 720 and a focus assembly 722. The beam transport system 720 receives the amplified light beam 710 from the laser system 715, and steers and modifies the amplified light beam 710 as needed and outputs the amplified light beam 710 to the focus assembly 722. The focus assembly 722 receives the amplified light beam 710 and focuses the beam 710 to the plasma formation location 705.

In some implementations, the Laser system 715 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 715 produces an amplified light beam 710 due to the population inversion in the gain media of the laser amplifiers even if there is no laser cavity. Moreover, the laser system 715 may produce an amplified light beam 710 that is a coherent laser beam if there is a laser cavity to provide enough feedback to the laser system 715. The term "amplified light beam" encompasses one or more of: light from the laser system 715 that is merely amplified but not necessarily a coherent laser oscillation and light from the laser system 715 that is amplified and is also a coherent laser oscillation.

The optical amplifiers in the laser system 715 may include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 715 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 715 may also include a cooling system such as water that may be used when operating the laser system 715 at higher powers.

The light source 700 includes a collector mirror 735 having an aperture 740 to allow the amplified light beam 710 to pass through and reach the plasma formation location 705. The collector mirror 735 may be, for example, an ellipsoidal mirror that has a primary focus at the plasma formation location 705 and a secondary focus at an intermediate location 745 (also called an intermediate focus) where the EUV light may be output from the light source 700 and may be input to, for example, an integrated circuit lithography tool (not shown). The light source 700 may also include an open-ended, hollow conical shroud 750 (for example, a gas cone) that tapers toward the plasma formation locution 705 from the collector mirror 735 to reduce the amount of plasma-generated debris that enters the focus assembly 722 and/or the beam transport system 720 while allowing the amplified light beam 710 to reach the plasma formation location 705. For this purpose, a gas flow may be provided in the shroud that is directed toward the plasma formation locution 705.

The light source 700 may also include a master controller 755 that is connected to a droplet position detection feedback system 756, a laser control system 757, and a beam control system 758. The light source 700 may include one or more target or droplet imagers 760 that provide an output indicative of the position of a droplet, for example, relative to the plasma formation location 705 and provide this output to the droplet position detection feedback system 756, which may, for example, compute a droplet position and trajectory from which a droplet position error may be computed either on a droplet by droplet basis or on average. The droplet position detection feedback system 756 thus provides the droplet position error as an input to the master controller 755. The master controller 755 may therefore provide a laser position, direction, and timing correction signal, for example, to the laser control system 757 that may be used, for example, to control the laser timing circuit and/or to the beam control system 758 to control an amplified light beam position and shaping of the beam transport system 720 to change the location and/or focal power of the beam focal spot within the chamber 730.

The supply system 725 includes a target material delivery control system 726 that is operable, in response to a signal from the master controller 755, for example, to modify the release point of the droplets as released by a target material supply apparatus 727 to correct for errors in the droplets arriving at the desired plasma formation location 705. The target material supply apparatus 727 includes a target formation apparatus that employs an adhesive such as the adhesive 234.

Additionally, the light source 700 may include light source detectors 765 and 770 that measures one or more EUV light parameters, including hut not limited to, pulse energy, energy distribution as a function of wavelength, energy within a particular band of wavelengths, energy outside of a particular band of wavelengths, and angular distribution of EUV intensity and/or average power. The light source detector 765 generates a feedback signal for use by the master controller 755. The feedback signal may be, for example, indicative of the errors in parameters such as the timing and focus of the laser pulses to properly intercept the droplets in the right place and time for effective and efficient EUV light production.

The light source 700 may also include a guide laser 775 that may be used to align various sections of the light source 700 or to assist in steering the amplified light beam 710 to the plasma formation location 705. In connection with the guide laser 775, the light source 700 includes a metrology system 724 that is placed within the focus assembly 722 to sample a portion of light from the guide laser 775 and the amplified light beam 710. In other implementations, the metrology system 724 is placed within the beam transport system 720. The metrology system 724 may include an optical element that samples or re-directs a subset of the light, such optical element being made out of any material that may withstand the powers of the guide laser beam and the amplified light beam 710. A beam analysis system is formed from the metrology system 724 and the master controller 755 since the master controller 755 analyzes the sampled light from the guide laser 775 and uses this information to adjust components within the focus assembly 722 through the beam control system 758.

Thus, in summary, the light source 700 produces an amplified light beam 710 that is directed along the beam path to irradiate the target mixture 714 at the plasma formation location 705 to convert the target material within the mixture 714 into plasma that emits light in the EUV range. The amplified light beam 710 operates at a particular wavelength (that is also referred to as a drive laser wavelength) that is determined based on the design and properties of the laser system 715. Additionally, the amplified light beam 710 may be a laser beam when the target material provides enough feedback back into the laser system 715 to produce coherent laser light or if the drive laser system 715 includes suitable optical feedback to form a laser cavity.

The implementations may further be described using the following clauses:

1. A system for an extreme ultraviolet light source, the system comprising: a capillary tube, the capillary tube comprising a sidewall extending from a first end to a second end, the sidewall comprising an exterior wall and an interior wall, the interior wall defining a passage that extends from the first end to the second end;
an actuator configured to be positioned at the exterior wall of the capillary tube; and an adhesive between the exterior wall and the actuator, the adhesive being configured to mechanically couple the actuator and die capillary tube, w lie rein the adhesive occupies a volume that remains substantially the same or expands as a result of curing.

2. The system of clause 1, wherein the adhesive occupies a volume that remains substantially the same or expands while increasing the temperature of the adhesive.

3. The system of clause 2, wherein the adhesive occupies a volume that continues to expand or remains substantially the same when the temperature of the adhesive is above a temperature associated with a gel point of the adhesive.

4. The system of clause 1, wherein the adhesive occupies a volume remains substantially the same or expands at least at some temperatures above a gel point of the adhesive.

5. The system of clause 1, wherein the adhesive comprises a benzoxazine resin or a resin containing benzoxazines.

6. The system of clause 1, wherein the adhesive comprises a cyanate ester resin or a resin containing cyanate esters.

7. The system of clause 1, wherein the actuator surrounds at least a portion of the exterior wall of the capillary tube, and the adhesive surrounds the portion of the exterior wall of the capillary tube.

8. The system of clause 7, wherein the actuator comprises a piezo-electric modulator.

9. The system of clause 1, further comprising a control system coupled to the actuator, the control system being configured to provide an actuation signal to the actuator, the actuation signal being sufficient to cause the actuator to vibrate at a frequency.

10. A system for an extreme ultraviolet light source, the system comprising:
a tube comprising a sidewall extending from a first opening at a first end to a second opening at a second end, the sidewall comprising an exterior wall and an interior wall, the inferior wall defining a passage Unit extends from the first end to the second end:
an actuator that surrounds a portion of the exterior wall of the tube; and
an adhesive that fills a region between the portion of the exterior wall and the actuator such that the adhesive is in contact with the portion of the exterior wall and the actuator, wherein, during operational use: molten metal target material flows into the second opening of the tube and out of the first opening of the tube while the actuator vibrates tire lube to form a stream of target material droplets, and the adhesive remains in contact with the portion of the exterior wall and the actuator.

11. The system of clause 10, wherein, during operational use, the exterior wall is heated to a temperature that is greater than a curing temperature of the adhesive, and the adhesive remains in contact with the portion of the exterior wall and the actuator when the exterior wall is heated to the temperature that is greater than the curing temperature.

12. The system of clause 10, wherein the adhesive occupies a volume that remains substantially the same or expands while increasing the temperature of the adhesive.

13. The system of clause 12, wherein the adhesive occupies a volume that continues to expand or remains substantially the same when the temperature of the adhesive is above a temperature associated with a gel point of the adhesive.

14. The system of clause 10, wherein the adhesive occupies a volume remains substantially the same or expands at least at some temperatures above a gel point of the adhesive.

15. The system of clause 10, wherein the adhesive comprises a benzoxazine resin or a resin containing benzoxazines.

16. The system of clause 10, wherein the adhesive comprises a cyanate ester resin or a resin containing cyanate esters.

17. The system of clause 10, wherein the actuator surrounds at least a portion of the exterior wall of the capillary lube, and the adhesive surrounds the portion of the exterior wall of the capillary lube.

18. An extreme ultraviolet light source comprising:
a vacuum vessel; and
a target material supply system configured to supply target material to an interior of the vacuum vessel, the target material supply system comprising:
a reservoir configured to hold molten target material and to apply pressure to the molten target material, the molten target material emitting extreme ultraviolet light when in a plasma state; and
a droplet generator comprising:
a capillary tube, the capillary tube comprising a sidewall extending from a first end to a second end, the sidewall comprising an exterior wall and an interior wall, the interior wall defining a passage that extends from the first end to the second end, the passage configured to receive molten target material front the reservoir;
an actuator configured to be positioned at the exterior wall of the capillary tube; and
an adhesive that has a volume that remains substantially the same or expands as a result of curing, the adhesive being between the exterior wall and the actuator, and the adhesive being configured to mechanically couple the actuator and the capillary tube.

19. The extreme ultraviolet light source of clause 18, wherein the adhesive occupies a volume that remains substantially the same or expands while increasing the temperature of the adhesive.

20. The extreme ultraviolet light source of clause 19, wherein the adhesive occupies a volume that continues to expand or remains substantially the same when the temperature of the adhesive is above a temperature associated with a gel point of the adhesive.

21. The extreme ultraviolet light source of clause 18, wherein the adhesive occupies a volume that remains substantially the same or expands during curing.

Other implementations are within the scope of the claims.

What is claimed is:

1. A system for an extreme ultraviolet light source, the system comprising:
a capillary tube, the capillary tube comprising a sidewall extending from a first end to a second end, the sidewall comprising an exterior wall and an interior wall, the interior wall defining a passage that extends from the first end to the second end;
an actuator configured to be positioned at the exterior wall of the capillary lube; and
an adhesive between the exterior wall and the actuator, the adhesive being configured to mechanically couple the actuator and the capillary tube, wherein the adhesive occupies a volume that remains substantially the same or expands as a result of curing.

2. The system of claim 1, wherein the adhesive occupies a volume that remains substantially the same or expands while increasing the temperature of the adhesive.

3. The system of claim 2, wherein the adhesive occupies a volume that continues to expand or remains substantially the same when the temperature of the adhesive is above a temperature associated with a gel point of the adhesive.

4. The system of claim 1, wherein the adhesive occupies a volume remains substantially the same or expands at least at some temperatures above a gel point of the adhesive.

5. The system of claim 1, wherein the adhesive comprises a benzoxazine resin or a resin containing benzoxazines.

6. The system of claim 1, wherein the adhesive comprises a cyanate ester resin or a resin containing cyanate esters.

7. The system of claim 1, wherein the actuator surrounds at least a portion of the exterior wall of the capillary tube, and the adhesive surrounds the portion of the exterior wall of the capillary tube.

8. The system of claim 7, wherein the actuator comprises a piezo-electric modulator.

9. The system of claim 1, further comprising a control system coupled to the actuator, the control system being configured to provide an actuation signal to the actuator, the actuation signal being sufficient to cause the actuator to vibrate at a frequency.

10. A system for an extreme ultraviolet light source, the system comprising:
a tube comprising a sidewall extending from a first opening at a first end to a second opening at a second end, the sidewall comprising an exterior wall and an interior wall, the interior wall defining a passage that extends from the first end to the second end;
an actuator that surrounds a portion of the exterior wall of the tube; and
an adhesive that fills a region between the portion of the exterior wall and the actuator such that the adhesive is in contact with the portion of the exterior waif and the actuator, wherein, during operational use: molten metal target material flows into the second opening of the tube and out of the first opening of the tube while the actuator vibrates the tube to form a stream of target material droplets, and the adhesive remains in contact with the portion of the exterior w all and the actuator.

11. The system of claim 10, wherein, during operational use, the exterior wall is heated to a temperature that is greater than a curing temperature of the adhesive, and the adhesive remains in contact with the portion of the exterior wall and the actuator when the exterior wall is heated to the temperature that is greater than the curing temperature.

12. The system of claim 10, wherein the adhesive occupies a volume that remains substantially the same or expands while increasing the temperature of the adhesive.

13. The system of claim 12, wherein the adhesive occupies a volume that continues to expand or remains substantially the same w hen the temperature of the adhesive is above a temperature associated with a gel point of the adhesive.

14. The system of claim 10, wherein the adhesive occupies a volume remains substantially the same or expands at least at some temperatures above a gel point of the adhesive.

15. The system of claim 10, wherein the adhesive comprises a benzoxazine resin or a resin containing benzoxazines.

16. The system of claim 10, wherein the adhesive comprises a cyanate ester resin or a resin containing cyanate esters.

17. The system of claim 10, wherein the actuator surrounds at least a portion of the exterior wall of the capillary tube, and the adhesive surrounds the portion of the exterior wall of the capillary tube.

18. An extreme ultraviolet light source comprising:
a vacuum vessel; and
a target material supply system configured to supply target material to an interior of the vacuum vessel, the target material supply system comprising:
   a reservoir configured to hold molten target material and to apply pressure to the molten target material, the molten target material emitting extreme ultraviolet light when in a plasma state; and
   a droplet generator comprising:
      a capillary tube, the capillary tube comprising a sidewall extending from a first end to a second end, the sidewall comprising an exterior wall and an interior wall, the interior wall defining a passage that extends from the first end to the second end, the passage configured to receive molten target material from the reservoir;
      an actuator configured to be positioned at the exterior wall of the capillary lube; and
      an adhesive that has a volume that remains substantially the same or expands as a result of curing, the adhesive being between the exterior wall and the actuator, and the adhesive being configured to mechanically couple the actuator and the capillary tube.

19. The extreme ultraviolet light source of claim 18, wherein the adhesive occupies a volume that remains substantially the same or expands while increasing the temperature of the adhesive.

20. The extreme ultraviolet light source of claim 19, wherein the adhesive occupies a volume that continues to expand or remains substantially the same when the temperature of the adhesive is above a temperature associated with a gel point of the adhesive.

21. The extreme ultraviolet light source of claim 18, wherein the adhesive occupies a volume that remains substantially the same or expands during curing.

* * * * *

UNITED STATES PATENT AND TRADEMARK OFFICE
CERTIFICATE OF CORRECTION

PATENT NO. : 11,448,967 B2
APPLICATION NO. : 17/273978
DATED : September 20, 2022
INVENTOR(S) : Georgiy Olegovich Vaschenko It is certified that error appears in the above-identified patent and that said Letters Patent is hereby corrected as shown below:

In the Claims

Column 20, Line 26, Claim 1 "capillary lube" should read --capillary tube--.

Column 21, Line 1, Claim 10, "exterior waif" should read --exterior wall--.

Column 21, Line 7, Claim 10, "exterior w all" should read --exterior wall--.

Column 21, Line 20, Claim 13, "same w hen" should read --same when--.

Column 22, Line 18, Claim 18, "capillary lube" should read --capillary tube--.

Signed and Sealed this
Twenty-fifth Day of October, 2022

Katherine Kelly Vidal
*Director of the United States Patent and Trademark Office*